United States Patent
Jang

(10) Patent No.: US 9,064,751 B2
(45) Date of Patent: Jun. 23, 2015

(54) THIN FILM TRANSISTOR ARRAY SUBSTRATE AND MANUFACTURING METHOD THEREOF

(71) Applicant: LG Display Co., Ltd., Seoul (KR)

(72) Inventor: Jin-Hee Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/102,726

(22) Filed: Dec. 11, 2013

(65) Prior Publication Data

US 2014/0183537 A1    Jul. 3, 2014

(30) Foreign Application Priority Data

Dec. 27, 2012  (KR) ......................... 10-2012-0154291

(51) Int. Cl.
*H01L 27/12* (2006.01)

(52) U.S. Cl.
CPC .......... *H01L 27/124* (2013.01); *H01L 27/1259* (2013.01)

(58) Field of Classification Search
CPC ............ H01L 27/1214; H01L 27/3274; H01L 29/0847; H01L 29/41733; H01L 29/42384; H01L 29/4908; H01L 29/7831; H01L 29/786; H01L 2924/13069

See application file for complete search history.

(56) References Cited

U.S. PATENT DOCUMENTS

2013/0270562 A1*  10/2013  Yamazaki ...................... 257/57

* cited by examiner

*Primary Examiner* — Hoai V Pham
(74) *Attorney, Agent, or Firm* — Morgan, Lewis & Bockius LLP

(57) ABSTRACT

Disclosed is a thin-film transistor array substrate including a Gate driver In Panel (GIP). The GIP includes a first wiring on a substrate, a first insulating film covering the first wiring, a second wiring on the first insulating film, a second insulating film covering the second wiring, a third insulating film over the second insulating film, first and second contact holes to expose the first and second wirings, and a third wiring on the third insulating film for connection of the first and second wirings. The third insulating film includes a first area corresponding to the first and second contact holes, a second area corresponding to a region between the first and second contact holes within a first thickness range, and a remaining third area within a second thickness range, the minimum value of the first thickness range being greater than the maximum value of the second thickness range.

6 Claims, 8 Drawing Sheets

THIN FILM TRANSISTOR ARRAY SUBSTRATE AND MANUFACTURING METHOD THEREOF

This application claims the benefit of Korean Patent Application No. 10-2012-0154291, filed on Dec. 27, 2012, which is hereby incorporated by reference as if fully set forth herein.

BACKGROUND OF THE INVENTION

1. Field of the Invention

The present invention relates to a thin film transistor array substrate having a Gate driver In Panel (GIP) and a manufacturing method thereof, and more particularly to a thin film transistor array substrate and a manufacturing method thereof, which may enhance reliability of a GIP.

2. Discussion of the Related Art

Recent transition into an information-oriented society has caused rapid development in the field of displays to visually represent electrical information signals, and correspondingly a variety of flat panel display devices exhibiting excellent properties, such as being thin and lightweight as well as requiring low power consumption, have been continuously studied.

Representative examples of these flat panel display devices may include Liquid Crystal Display (LCD) devices, Plasma Display Panel (PDP) devices, Field Emission Display (FED) devices, Electro Luminescence Display (ELD) devices, Electro-Wetting Display (EWD) devices, and Organic Light Emitting Diode (OLED) display devices. These flat panel display devices include in common a flat panel display panel for image formation as an essential component. Such a flat panel display panel has a configuration in which a pair of substrates is bonded to face each other with a light emitting material or polarizer interposed therebetween.

In general, an active matrix driving mode flat panel display device includes a thin film transistor array substrate having a cell array configured to independently drive a plurality of pixel areas respectively.

The cell array includes gate lines and data lines intersecting each other to define the plurality of pixel areas, a plurality of switching elements formed at intersections of the gate lines and the data lines to correspond to the plurality of pixel areas, and a plurality of pixel electrodes corresponding respectively to the plurality of pixel areas, the pixel electrodes being connected to the plurality of switching elements.

The gate lines are connected to a gate driver to apply gate signals respectively to the plurality of pixel areas, and the data lines are connected to a data driver to apply data signals respectively to the plurality of pixel areas.

In this case, the gate driver is a circuit that outputs gate signals to at least one of the plurality of gate lines in sequence, and is simpler than the data driver. Hence, the gate driver may constitute a part of the thin film transistor array substrate in order to reduce process number, shorten process time, and reduce material costs. The gate driver as a part of the thin film transistor array substrate is referred to as a Gate driver In Panel (GIP).

Typically, a GIP needs a limited number of metal layers, and therefore includes at least one jumper to prevent short-circuit between wirings.

FIG. 1 is a sectional view showing a typical GIP.

As exemplarily shown in FIG. 1, the typical GIP 10 includes a first wiring 12 formed on a substrate 11, a first insulating film 13 configured to cover the first wiring 12, a second wiring 14 formed on the first insulating film 13, a second insulating film 15 configured to cover the second wiring 14, and a third wiring 16 formed on the second insulating film 15 to connect the first and second wirings 12 and 14 to each other through first and second contact holes CT1 and CT2.

Here, the first insulating film 13 must have a tapered portion due to the first wiring 12 formed therebelow, and the second insulating film 15 must have a tapered portion due to the first wiring 12 and the second wiring 14 formed therebelow.

In addition, the third wiring 16 formed on the second insulating film 15 is configured to correspond to the first and second contact holes CT1 and CT2 and a gap region between the contact holes CT1 and CT2, and thus serves as a jumper that connects the first and second wirings 12 and 14 to each other.

Meanwhile, to minimize the number of masking processes, the first and second contact holes CT1 and CT2 are formed via the same exposure masking process. More specifically, in a state in which an exposure mask (not shown) is formed on the second insulating film 15, the first and second insulating films 13 and 15 are subjected to etching. The exposure mask has openings to expose portions of the second insulating film 15 corresponding respectively to the first and second contact holes CT1 and CT2. In this case, etching needs to be continued until the first contact hole CT1 is completely formed even after formation of the second contact hole CT2, which causes over-etching of the second insulating film 15.

In addition, when removing the exposure mask from the second insulating film 15 after formation of the first and second contact holes CT1 and CT2, the second insulating film 15 may be damaged, and in particular the tapered portion of the second insulating film 15 may be partially removed along with the exposure mask.

Such partial removal of the second insulating film 15, caused by over-etching and removal of the exposure mask, height difference due to the second insulating film 15 is more increased.

In particular, if the above-described increased height difference due to partial removal of the second insulating film 15 occurs in a gap region between the first and second contact holes CT1 and CT2, as exemplarily shown by a dotted-line circle in FIG. 1, the third wiring 16 formed on the second insulating film 15 may be disconnected. This deteriorates reliability of the jumper between the first and second wirings 12 and 14 and reliability of the GIP.

SUMMARY OF THE INVENTION

Accordingly, the present invention is directed to a thin film transistor array substrate and a manufacturing method thereof that substantially obviate one or more problems due to limitations and disadvantages of the related art.

An object of the present invention is to provide a thin film transistor array substrate and a manufacturing method thereof, which may prevent disconnection of a jumper, thereby enhancing reliability of a Gate driver In Panel (GIP).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the present invention, as embodied and broadly described herein, a thin film transistor array substrate includes a cell array corresponding to a display area, and a Gate driver In Panel (GIP) corresponding to a partial area of a non-display area around the display area, wherein the GIP includes a first wiring formed on a substrate, a first insulating film formed over the substrate to cover the first wiring, a second wiring formed on the first insulating film, a second insulating film formed over the first insulating film to cover the second wiring, a third insulating film formed over the second insulating film, a first contact hole perforated through the first, second, and third insulating films to expose a part of the first wiring, a second contact hole perforated through the second and third insulating films to expose a part of the second wiring, and a third wiring formed on the third insulating film to connect the first and second wirings to each other through the first and second contact holes.

Here, the third insulating film includes a first area, a second area and a third area. The first area corresponding to the first and second contact holes is where the third insulating film is removed. The second area corresponding to a gap region between the first and second contact holes is within a first thickness range. And a third area being as a remaining area except for the first and second areas, is within a second thickness range different from the first thickness range. Furthermore, the minimum value of the first thickness range is greater than the maximum value of the second thickness range.

In accordance with another aspect of the invention, in a manufacturing method of a thin film transistor array substrate, the thin film transistor array substrate including a cell array configured to define a plurality of pixel areas corresponding to a display area, and a Gate driver In Panel (GIP) corresponding to a partial area of a non-display area around the display area, the method includes forming a first wiring on the partial area of the non-display area by patterning a first metal film on a substrate, forming a first insulating film over the substrate to cover the first wiring, forming a second wiring on the partial area of the non-display area by patterning a second metal film on the first insulating film, forming a second insulating film over the first insulating film to cover the second wiring, forming a photoresist film over the second insulating film, forming a third insulating film by patterning the photoresist film using a half-tone mask placed above the photoresist film, wherein the third insulating film includes a first area, a second area and a third area, the first area exposing the second insulating film to correspond to a part of each of the first wiring and the second wiring, the second area corresponding to a gap region between both first areas, the second area being within a first thickness range, and the third area as a remaining area except for the first and second areas, the third area being within a second thickness range different from the first thickness range, forming a first contact hole and a second contact hole by etching the first and second insulating films using the third insulating film as a mask, the first contact hole perforated through the first, second, and third insulating films to expose a part of the first wiring, and the second contact hole perforated through the second and third insulating films to expose a part of the second wiring, and forming a third wiring in the partial area of the non-display area to connect the first and second wirings to each other through the first and second contact holes by patterning a third metal film on the third insulating film, and wherein the minimum value of the first thickness range is greater than the maximum value of the second thickness range.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiment(s) of the invention and together with the description serve to explain the principle of the invention. In the drawings.

DETAILED DESCRIPTION OF THE INVENTION

Hereinafter, a thin film transistor array substrate and a manufacturing method thereof according to respective embodiments of the present invention will be described in detail with reference to the accompanying drawings.

First, a thin film transistor array substrate according to one embodiment of the present invention will be described with reference to FIGS. 2 to 5.

Figure 1:
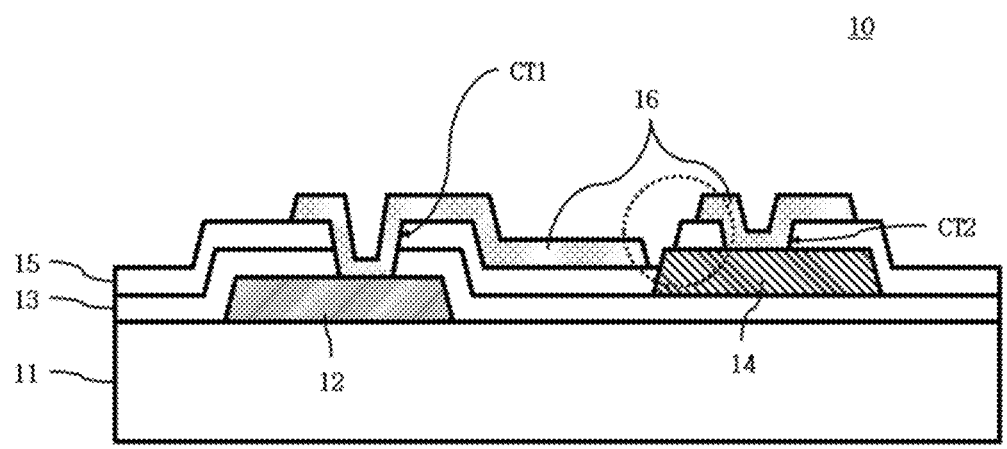
FIG. 1 is a sectional view showing a typical GIP.
Figure 2:
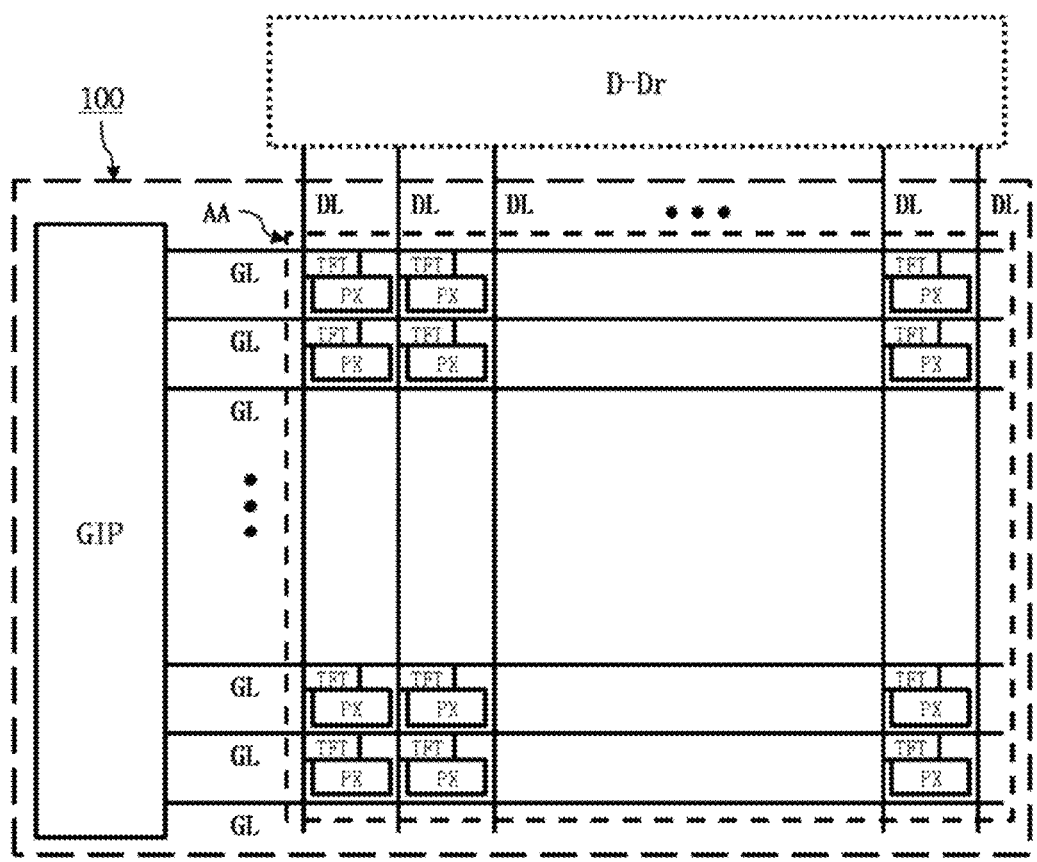
FIG. 2 is a diagram showing a thin film transistor array substrate according to one embodiment of the present invention.
Figure 3:
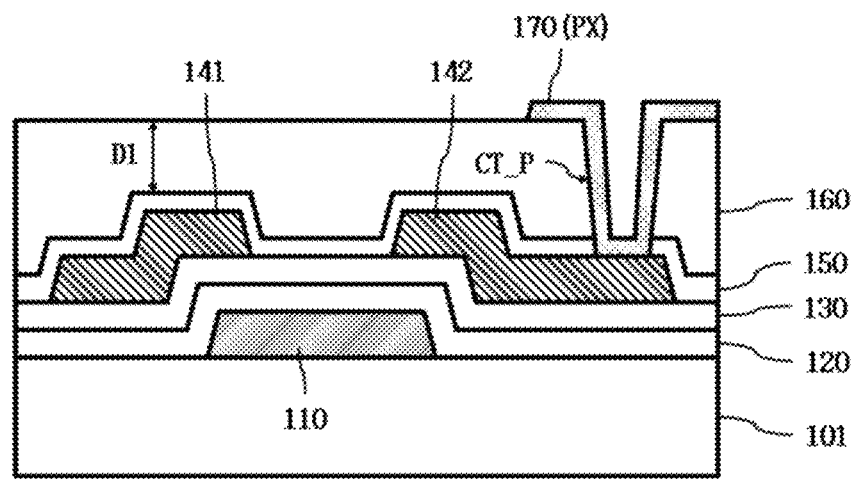
FIG. 3 is a sectional view showing a TFT of FIG. 2.
Figure 4:
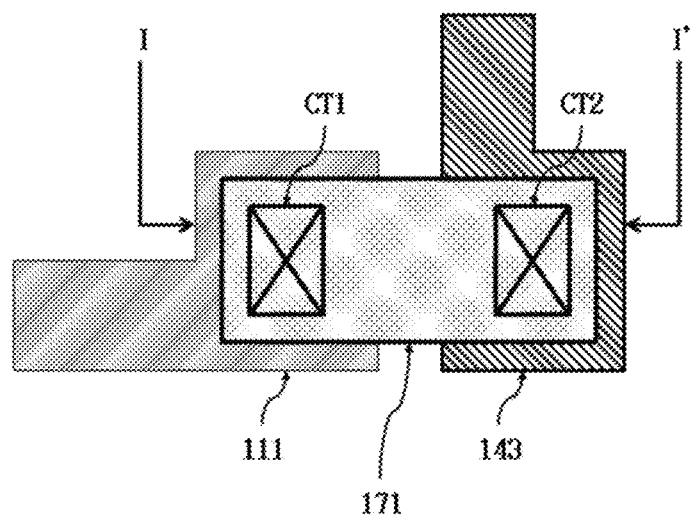
FIG. 4 is a plan view showing a jumper of a GIP of FIG. 2.
Figure 5:
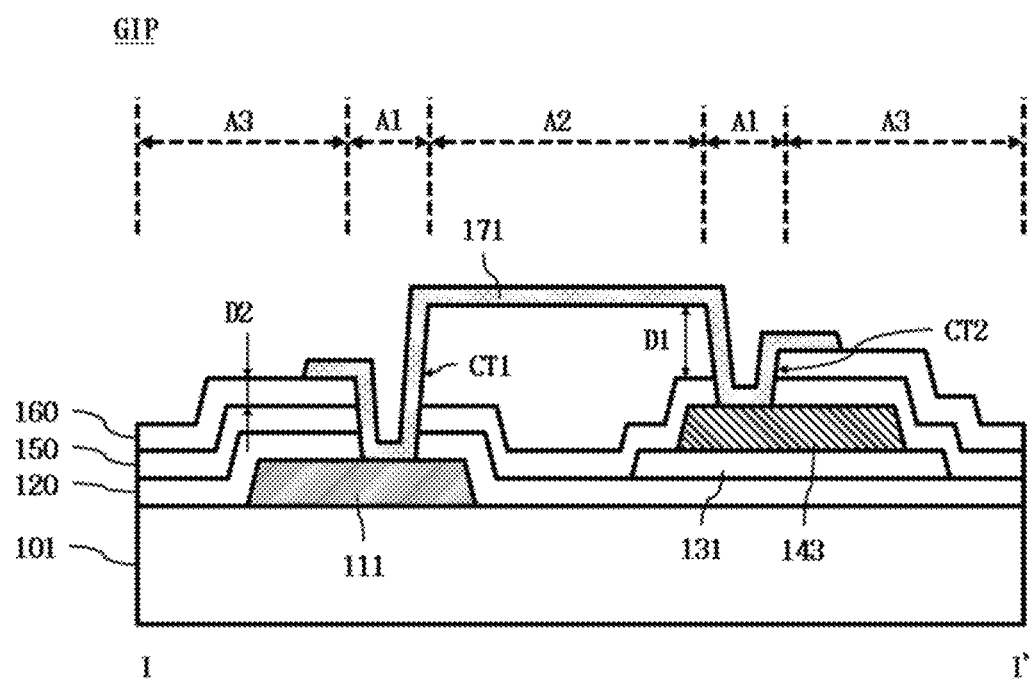
FIG. 5 is a sectional view taken along line I-I' of FIG. 4.

FIG. 2 is a diagram showing a thin film transistor array substrate according to one embodiment of the present invention, and FIG. 3 is a sectional view showing a TFT of FIG. 2. In addition, FIG. 4 is a plan view showing a jumper of a GIP of FIG. 2, and FIG. 5 is a sectional view taken along line I-I' of FIG. 4.

As exemplarily shown in FIG. 2, the thin film transistor array substrate 100 according to one embodiment of the present invention includes a cell array corresponding to a display area AA, and a Gate driver In Panel (GIP) corresponding to a part of a non-display area around the display area AA.

The cell array includes gate lines GL and data lines DL intersecting each other to define a plurality of pixel areas corresponding to the display area AA, a plurality of Thin Film Transistors (TFTs) provided at intersections of the gate lines GL and the data lines DL to correspond to the plurality of pixel areas, and a plurality of pixel electrodes PX corresponding respectively to the plurality of pixel areas, the pixel electrodes PX being connected to the plurality of TFTs.

The gate lines GL are connected to the GIP that is a gate driver constituting a part of the thin film transistor array substrate 100, and apply gate signals respectively to the plurality of TFTs.

The data lines DL are connected to a data driver D-Dr, and apply data signals respectively to the plurality of TFTs.

As exemplarily shown in FIG. 3, each of the plurality of TFTs includes a gate electrode 110 formed on a substrate 101, a first insulating film 120 formed over the substrate 101 to cover the gate electrode 110, an active layer 130 formed on the first insulating film 120 using a semiconductor material to overlap at least a part of the gate electrode 110, a source electrode 141 and a drain electrode 142 formed on the active layer 130 at opposite positions spaced apart from each other to overlap at least a part of the active layer 130 respectively, a second insulating film 150 formed over the first insulating film 120 to cover each of the active layer 130, the source electrode 141, and the drain electrode 142, and a third insulating film 160 formed on the second insulating film 150 within a first thickness range D1.

Although not shown in FIG. 3 in detail, the gate electrode 110 is formed on the substrate 101 so as to be branched from a gate line (GL in FIG. 2) arranged in a first direction to correspond to each pixel area. The source electrode 141 is formed on the first insulating film 120 so as to be branched from a data line (DL in FIG. 2) arranged in a second direction to correspond to each pixel area, the second direction intersecting the first direction.

The active layer 130 and the source and drain electrodes 141 and 142 may be formed via a single masking process as a semiconductor film and a second metal layer sequentially stacked on the first insulating film 120 are differentially patterned using a half-tone mask.

A pixel electrode 170 (PX in FIG. 2) is formed on the third insulating film 160. The pixel electrode 170 is connected to the drain electrode 142 through a pixel contact hole CT_P that is perforated through the second and third insulating films 150 and 160 to expose a part of the drain electrode 142.

As exemplarily shown in FIG. 4, the GIP includes a first wiring 111, a second wiring 143, a first contact hole CT1 corresponding to a part of the first wiring 111, a second contact hole CT2 corresponding to a part of the second wiring 143, and a third wiring 171 configured to connect the first and second wirings 111 and 143 to each other through the first and second contact holes CT1 and CT2. Here, the third wiring 171 is formed in an area including all of the first and second contact holes CT1 and CT2 and a gap region between the contact holes CT1 and CT2.

More specifically, as exemplarily shown in FIG. 5, the GIP includes the first wiring 111 formed on the substrate 101, the first insulating film 120 formed over the substrate 101 to cover the first wiring 111, the second wiring 143 formed on the first insulating film 120, the second insulating film 150 formed over the first insulating film 120 to cover the second wiring 143, the third insulating film 160 formed over the second insulating film 150, the first contact hole CT1 perforated through the first, second, and third insulating films 120, 150, and 160 to expose a part of the first wiring 111, the second contact hole CT2 perforated through the second and third insulating films 150 and 160 to expose a part of the second wiring 143, and the third wiring 171 formed on the third insulating film 160 to connect the first and second wirings 111 and 143 to each other through the first and second contact holes CT1 and CT2.

In addition, the GIP may further include a semiconductor material layer 131 interposed between the second wiring 143 and the first insulating film 120.

The first wiring 111 is formed, along with the gate electrode (110 in FIG. 3) of the TFT, on the substrate 101 by patterning a first metal layer on the substrate 101.

The first insulating film 120 is formed over the substrate 101 to cover each of the gate electrode 110 of the TFT and the first wiring 111.

The semiconductor material layer 131 is formed, along with the active layer (130 in FIG. 3) of the TFT, on the first insulating film 120.

The second wiring 143 is formed, along with the source and drain electrodes (141 and 142 in FIG. 3) of the TFT, on the semiconductor material layer 131. In this case, a sequential stacking configuration of the semiconductor material layer 131 and the second wiring 143 is realized via a single masking process as the semiconductor film and the second metal layer on the first insulating film 120 are differentially patterned using the half-tone mask in the same manner as the active layer 130 and the source and drain electrodes 141 and 142 of the TFT.

The second insulating film 150 is formed over the first insulating film 120 to cover each of the active layer 130 and the source and drain electrodes 141 and 142 of the TFT and the second wiring 143.

The third insulating film 160 is formed on the second insulating film 150, and consists of first to third areas A1, A2, and A3 having different thicknesses.

In addition, the third insulating film 160 is used as a mask during etching of the first and second insulating films 120 and 150 to form the first and second contact holes CT1 and CT2. To this end, the third insulating film 160 is formed of a photoresist material for exposure. In one example, the third insulating film 160 may be formed of negative photoacryl.

The first area A1 of the third insulating film 160 is a region where the third insulating film 160 is removed to correspond to the pixel contact hole CT_P of the TFT and the first and second contact holes CT1 and CT2. That is, the first area A1 is a zero-thickness area.

The second area A2 of the third insulating film 160 corresponds to the gap region between the first and second contact holes CT1 and CT2, and is within the first thickness range D1. Here, the first thickness range D1 refers to a thickness to prevent a tapered portion of the second insulating film 150 below the third insulating film 160 from being copied to the third insulating film 160. In this way, in the second area A2, an upper surface of the third insulating film 160 may be flat, or may exhibit less height difference between neighboring portions than the second insulating film 150.

In addition, as exemplarily shown in FIG. 3, the TFT may include the third insulating film 160 within the first thickness range D1, in order to ensure storage capacitance.

The third area A3 of the third insulating film 160 is a remaining area except for the first and second areas A1 and A2 and is within a second thickness range D2 different from the first thickness range D1. In this case, to prevent generation of unnecessary parasitic capacitance from the GIP, the third area A3 is thinner than the second area A2.

In other words, the minimum value of the first thickness range D1 is greater than the maximum value of the second thickness range D2.

The third wiring 171 is formed on the third insulating film 160 to come into contact with each of the first and second wirings 111 and 143 through the first and second contact holes CT1 and CT2. Thus, the third wiring 171 serves as a jumper that connects the first wiring 111 and the second wiring 143 to each other.

As described above, in the thin film transistor array substrate according to one embodiment of the present invention, the GIP includes the third insulating film 160, an area of which corresponding to the gap region between the first contact hole CT1 and the second contact hole CT2 is thicker than the remaining area so as to be within the first thickness range D1. Thereby, it is possible to prevent the third wiring 171 on the third insulating film 160, which serves as a jumper for the first and second wirings 111 and 143, from being disconnected due to height difference in the gap region between the first contact hole CT1 and the second contact hole CT2.

Providing only the second area A2 of the third insulating film 160 included in the GIP corresponding to the gap region between the first and second contact holes CT1 and CT2 with the first thickness range D1 may prevent unnecessary increase in the parasitic capacitance of the GIP.

In this way, reliability of the jumper and the GIP including the jumper may be enhanced, which may result in enhanced reliability of the thin film transistor array substrate.

Next, a manufacturing method of a thin film transistor array substrate according to one embodiment of the present invention will be described with reference to FIG. 6 and FIGS. 7A to 7H.

Figure 6:
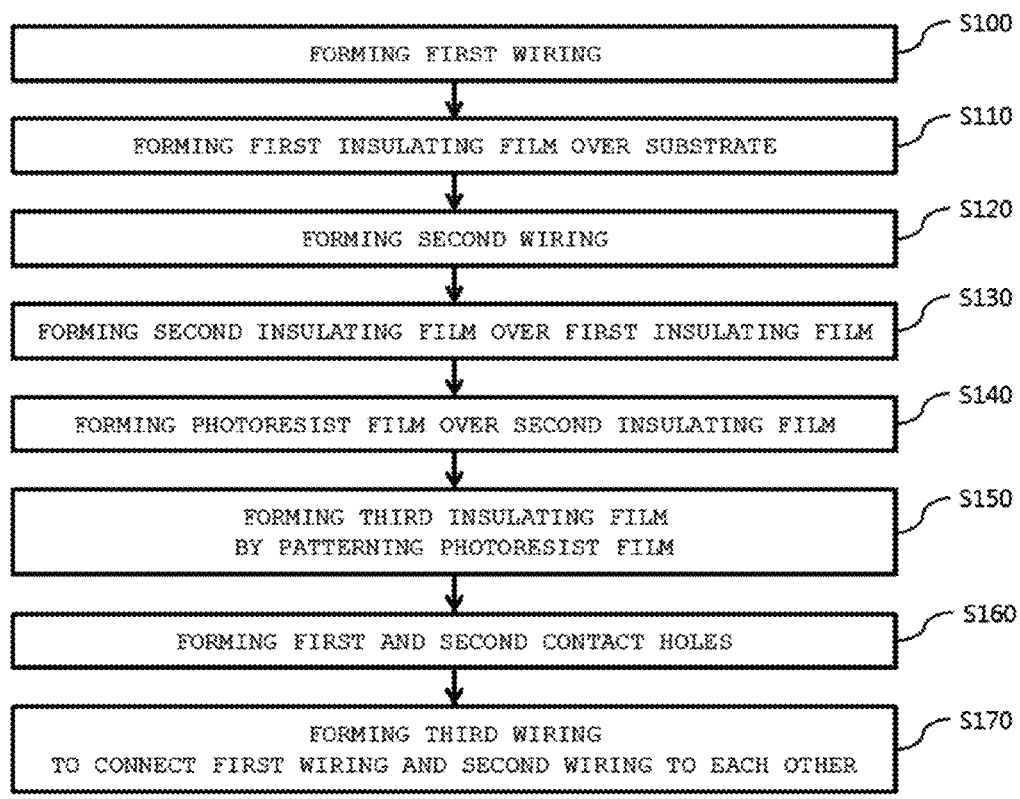
FIG. 6 is a flowchart showing a manufacturing method of a thin film transistor array substrate according to one embodiment of the present invention.

FIG. 6 is a flowchart showing a manufacturing method of a thin film transistor array substrate according to one embodiment of the present invention, and FIGS. 7A to 7H are process views showing respective operations of FIG. 6.

As exemplarily shown in FIG. 6, a manufacturing method of a thin film transistor array substrate according to one embodiment of the present invention includes forming a first wiring by patterning a first metal film on a substrate (S100), forming a first insulating film over the substrate to cover the first wiring (S110), forming a second wiring by patterning a second metal film on the first insulating film (S120), forming a second insulating film over the first insulating film to cover the second wiring (S130), forming a photoresist film over the second insulating film (S140), forming a third insulating film including first, second, and third areas having different thicknesses by patterning the photoresist film using a half-tone mask (S150), forming a first contact hole to expose a part of the first wiring and a second contact hole to expose a part of the second wiring by etching the first and second insulating films using the third insulating film as a mask (S160), and forming a third wiring to connect the first and second wirings to each other through the first and second contact holes by patterning a third metal film on the third insulating film (S170).

Figure 7A:
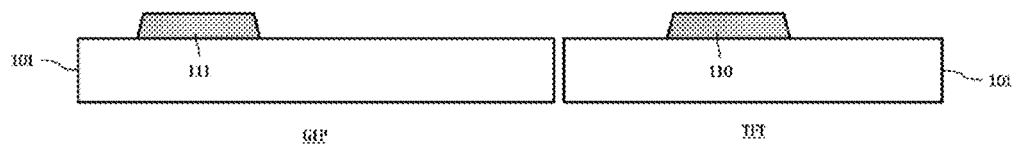
FIGS. 7A to 7H are process views showing respective operations of FIG. 6.

As exemplarily shown in FIG. 7A, the gate electrode 110 is formed in each pixel area of the display area (hereinafter referred to as TFT in FIGS. 7A to 7H) by patterning a first metal film on the substrate 101, and the first wiring 111 is formed on a partial area of the non-display area (hereinafter referred to as GIP in FIGS. 7A to 7H) (S100).

In this case, the display area (AA in FIG. 2) may further be provided with a gate line (GL in FIG. 2) that is arranged in a first direction and connected to the gate electrode 110.

Figure 7B:
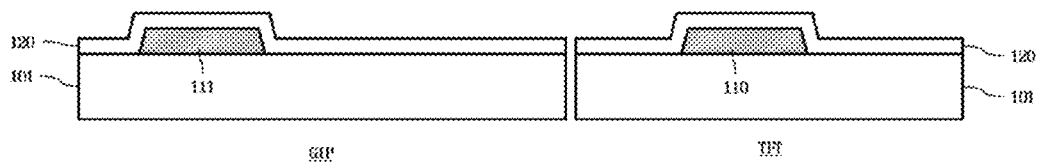

As exemplarily shown in FIG. 7B, the first insulating film 120 configured to cover each of the gate line GL, the gate electrode 110, and the first wiring 111 is formed over the substrate 101 (S110).

Figure 7C:
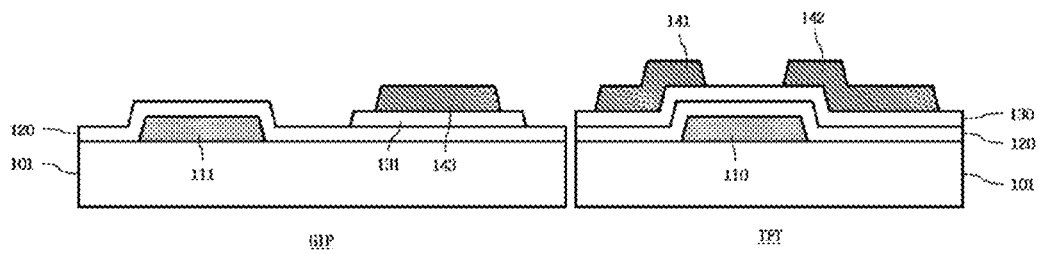

As exemplarily shown in FIG. 7C, by differentially patterning a semiconductor film and a second metal film on the first insulating film 120, the active layer 130 configured to overlap at least a part of the gate electrode 110 and the source and drain electrodes 141 and 142 configured to overlap both sides of the active layer 130 are respectively formed in each pixel area TFT and the second wiring 143 is formed in the partial area GIP of the non-display area. In this case, the semiconductor material layer 131 interposed between the second wiring 143 and the first insulating film 120 is formed on the partial area GIP of the non-display area (S120).

In addition, the display area (AA in FIG. 2) may further be provided with a data line (DL in FIG. 2) that is arranged in a second direction intersecting the first direction and connected to the source electrode 141 to define a plurality of pixel areas corresponding to the display area (AA in FIG. 2).

Figure 7D:
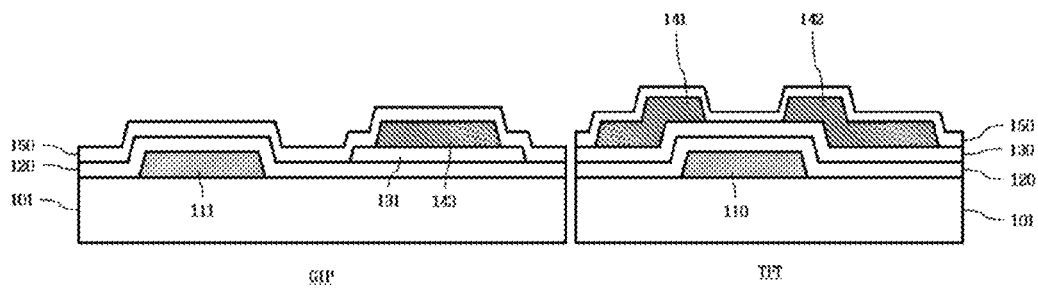

As exemplarily shown in FIG. 7D, the second insulating film 150 configured to cover each of the data line DL, the active layer 130, the source electrode 141, the drain electrode 142, the semiconductor material layer 131, and the second wiring 143 is formed over the first insulating film 120 (S130).

Figure 7E:
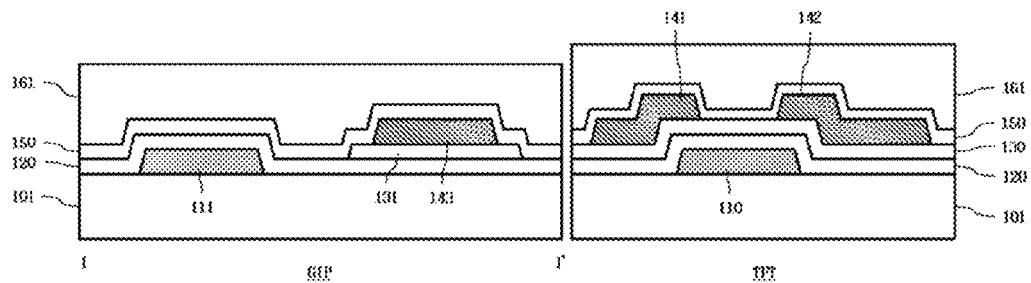

As exemplarily shown in FIG. 7E, a photoresist film 161 is formed over the second insulating film 150 (S140). Here, the photoresist film 161 may be within the first thickness range D1. Negative photoacryl may be selected to form the photoresist film 161.

Figure 7F:
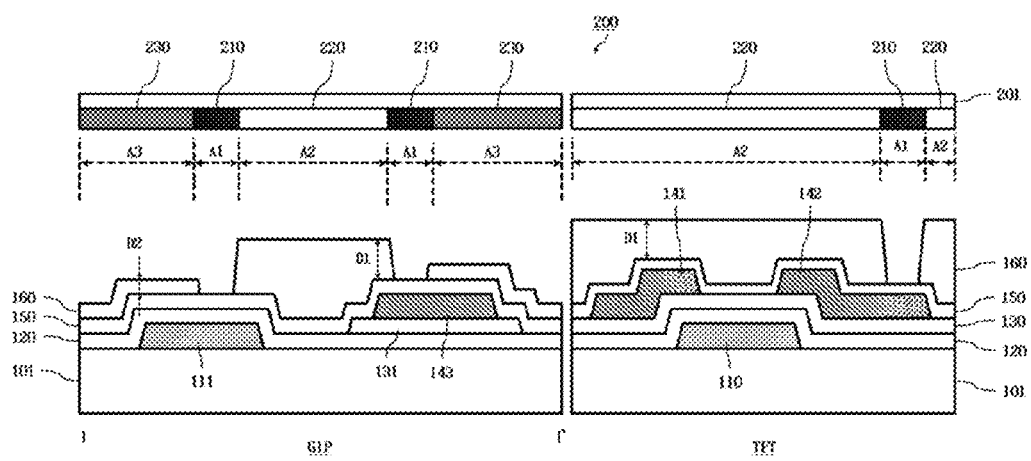

Thereafter, as exemplarily shown in FIG. 7F, the third insulating film 160 including the first, second, and third areas A1, A2, and A3 having different thicknesses is formed by patterning the photoresist film (161 in FIG. 7E) using a half-tone mask 200 placed above the photoresist film 161 (S150).

In the partial area GIP of the non-display area, the first area A1 of the third insulating film 160 corresponds to a part of each of the first wiring 111 and the second wiring 143. The third insulating film 160 is wholly removed in the first area A1 to expose the second insulating film 150. That is, the first area A1 is a zero-thickness area. The second area A2 corresponds to a gap region between both first areas A1 and is within the first thickness range D1. The third area A3 is a remaining area except for the first and second areas A1 and A2 and is within the second thickness range D2 different from the first thickness range D1. Here, the second area A2 is thicker than the third area A3. That is, the minimum value of the first thickness range D1 is greater than the maximum value of the second thickness range D2.

In each pixel area TFT, the third insulating film 160 includes the first area A1 where the third insulating film 160 is removed to expose the second insulating film 150 at a position corresponding to a part of the drain electrode 142, and the second area A2 as a remaining area except for the first area A1, the second area A2 being within the first thickness range D1.

Upon patterning the photoresist film 161 such that the third insulating film 160 includes the first, second, and third areas A1, A2, and A3 having different thicknesses as described above (S150), the half-tone mask 200 is used.

In one example, if the photoresist film 161 is formed of negative photoacryl, the half-tone mask 200 includes a light shield portion 210 corresponding to the first area A1, a transmissive portion 220 corresponding to the second area A2, and a transflective portion 230 corresponding to the third area A3.

Figure 7G:
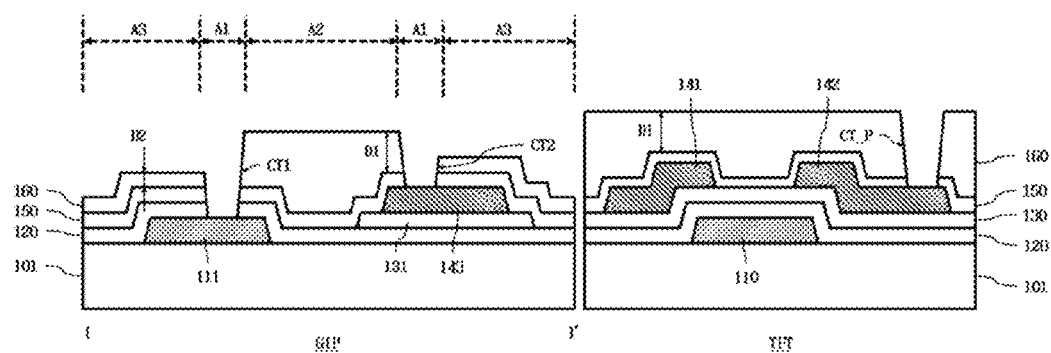

Subsequently, as exemplarily shown in FIG. 7G, the first contact hole CT1, the second contact hole CT2, and the pixel contact hole CT_P are formed by etching the first and second insulating films 120 and 150 using the third insulating film 160 as a mask (S160).

In this case, the first contact hole CT1 is perforated through the first, second, and third insulating films 120, 150, and 160 to expose a part of the first wiring 111.

The second contact hole CT2 is perforated through the second and third insulating films 150 and 160 to expose a part of the second wiring 143.

The pixel contact hole CT_P is perforated through the second and third insulating films 150 and 160 to expose a part of the drain electrode 142.

Figure 7H:
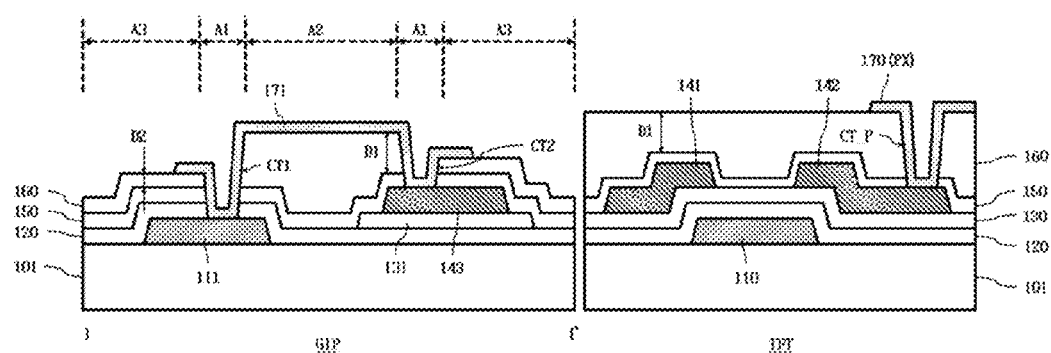

Next, as exemplarily shown in FIG. 7H, by patterning a third metal film on the third insulating film 160, the pixel electrode 170 connected to the drain electrode 142 through the pixel contact hole CT_P is formed in each pixel area TFT and the third wiring 171 connected to each of the first and second wirings 111 and 143 through the first and second contact holes CT1 and CT2 is formed in the partial area GIP of the non-display area (S170).

Here, the third wiring 171 serves as a jumper that connects the first and second wirings 111 and 143 to each other.

As described above, the manufacturing method of the thin film transistor array substrate according to one embodiment of the present invention includes forming the first and second contact holes CT1 and CT2 using the third insulating film 160 as a mask, which may prevent increase in the number of exposure masking processes despite addition of the third insulating film 160 and prevent damage to the second insulating film 150 during removal of the mask from the second insulating film 150. In this way, reliability of the jumper of the GIP and reliability of the thin film transistor array substrate may be enhanced.

As is apparent from the above description, a thin film transistor array substrate according to one embodiment of the present invention includes a Gate driver In Panel (GIP) formed on a partial area of a non-display area, and the GIP includes a first wiring on a substrate, a first insulating film configured to cover the first wiring, a second wiring on the first insulating film, second and third insulating films sequentially stacked one above another to cover the second wiring, and a third wiring formed on the third insulating film and connected to a part of each of the first and second wirings exposed through first and second contact holes to connect the first and second wirings to each other. Thereamong, the third insulating film includes a first area where the third insulating film is removed to correspond to the first and second contact holes, a second area corresponding to a gap region between the first and second contact holes, and a third area as a remaining area except for the first and second areas. In this case, the second area of the third insulating film is thicker than the third area.

Providing a part of the third insulating film corresponding to the gap region between the first and second contact holes with a greater thickness than the remaining part as described above may prevent a tapered portion of the second insulating film from being copied to the third insulating film, which may reduce height difference of the third insulating film in the gap region between the first and second contact holes. Thereby, it is possible to prevent the third wiring on the third insulating film from being disconnected due to height difference of the third insulating film, and consequently to enhance reliability of a jumper. This may result in enhanced reliability of the thin film transistor array substrate.

Moreover, only a part of the third insulating film corresponding to the gap region between the first and second contact holes is thick, which may prevent unnecessary increase in the parasitic capacitance of the GIP and consequently, prevent deterioration in reliability of the GIP.

In addition, according to one embodiment of the present invention, as a result of using the third insulating film as a mask to form the first and second contact holes, it is possible to prevent increase in the number of masking processes and to prevent damage to the second insulating film due to removal of the mask.

It will be apparent that, although the preferred embodiments have been shown and described above, the invention is not limited to the above-described specific embodiments, and various modifications and variations can be made by those skilled in the art without departing from the gist of the appended claims. Thus, it is intended that the modifications and variations should not be understood independently of the technical sprit or prospect of the invention.

What is claimed is:

1. A thin film transistor array substrate comprising a cell array corresponding to a display area, and a Gate driver In Panel (GIP) corresponding to a partial area of a non-display area around the display area,
   wherein the GIP includes:
   a first wiring formed on a substrate;
   a first insulating film formed over the substrate to cover the first wiring;
   a second wiring formed on the first insulating film;
   a second insulating film formed over the first insulating film to cover the second wiring;
   a third insulating film formed over the second insulating film;
   a first contact hole perforated through the first, second, and third insulating films to expose a part of the first wiring;
   a second contact hole perforated through the second and third insulating films to expose a part of the second wiring; and
   a third wiring formed on the third insulating film to connect the first and second wirings to each other through the first and second contact holes,
   wherein, in the partial area of the non-display area, the third insulating film includes a first area, a second area and a third area, the first area where the third insulating film is removed to correspond to the first and second contact holes, the second area corresponding to a gap region between the first and second contact holes, the second area being within a first thickness range, and the third area as a remaining area except for the first and second areas, the third area being within a second thickness range different from the first thickness range, and
   wherein the minimum value of the first thickness range is greater than the maximum value of the second thickness range.

2. The substrate according to claim 1, wherein the third insulating film is formed of a photoresist material.

3. The substrate according to claim 2, wherein the third insulating film is formed of negative photoacryl.

4. The substrate according to claim 1, wherein the cell array includes:
   gate lines and data lines intersecting each other to define a plurality of pixel areas corresponding to the display area;
   a plurality of thin film transistors formed at intersections of the gate lines and the data lines to correspond to the plurality of pixel areas; and
   a plurality of pixel electrodes corresponding to the plurality of pixel areas, the pixel electrodes being connected to the plurality of thin film transistors,
   wherein each of the plurality of thin film transistors includes:
   a gate electrode formed on the substrate;
   an active layer formed on the first insulating film to overlap at least a part of the gate electrode; and
   source and drain electrodes formed spaced apart from each other to overlap both sides of the active layer, and
   wherein the first insulating film further covers the gate electrode,
   wherein the second insulating film further covers the active layer and the source and drain electrodes,
   wherein the third insulating film being within the first thickness range is further formed on the second insulating film to correspond to each pixel area, and
   wherein each of the pixel electrodes is connected to the drain electrode through a pixel contact hole perforated through the second and third insulating films to expose a part of the drain electrode.

5. The substrate according to claim 4, wherein the first wiring is formed of the same material as the gate electrode,
   wherein the second wiring is formed of the same material as the source and drain electrodes, and
   wherein the third wiring is formed of the same material as the pixel electrode.

6. The substrate according to claim 5, wherein the GIP further includes a semiconductor material layer between the second wiring and the second insulating film, the semiconductor material layer being formed of the same material as the active layer.

\* \* \* \* \*